(12) United States Patent
Okahisa et al.

(10) Patent No.: US 8,845,992 B2
(45) Date of Patent: Sep. 30, 2014

(54) III-NITRIDE SINGLE-CRYSTAL INGOT, III-NITRIDE SINGLE-CRYSTAL SUBSTRATE, METHOD OF MANUFACTURING III-NITRIDE SINGLE-CRYSTAL INGOT, AND METHOD OF MANUFACTURING III-NITRIDE SINGLE-CRYSTAL SUBSTRATE

(75) Inventors: Takuji Okahisa, Itami (JP); Seiji Nakahata, Itami (JP); Tomoki Uemura, Itami (JP)

(73) Assignee: Sumitomo Electric Industries, Ltd. (JP)

( * ) Notice: Subject to any disclaimer, the term of this patent is extended or adjusted under 35 U.S.C. 154(b) by 0 days.

(21) Appl. No.: 12/864,874

(22) PCT Filed: Dec. 24, 2008

(86) PCT No.: PCT/JP2008/073368
§ 371 (c)(1),
(2), (4) Date: Jul. 28, 2010

(87) PCT Pub. No.: WO2009/096125
PCT Pub. Date: Aug. 6, 2009

(65) Prior Publication Data
US 2010/0322841 A1 Dec. 23, 2010

(30) Foreign Application Priority Data

Jan. 28, 2008 (JP) .................................. 2008-016677

(51) Int. Cl.
| | |
|---|---|
| C01B 21/06 | (2006.01) |
| C01C 1/02 | (2006.01) |
| C30B 23/00 | (2006.01) |
| C30B 25/00 | (2006.01) |
| C30B 28/12 | (2006.01) |
| C30B 29/40 | (2006.01) |
| C30B 33/12 | (2006.01) |
| C30B 25/02 | (2006.01) |

(52) U.S. Cl.
CPC .............. *C30B 29/403* (2013.01); *C30B 29/406* (2013.01); *C30B 33/12* (2013.01); *C30B 25/02* (2013.01)
USPC ........... 423/351; 423/406; 423/409; 423/353; 117/97; 117/84; 117/94

(58) Field of Classification Search
None
See application file for complete search history.

(56) References Cited

U.S. PATENT DOCUMENTS

| | | | | |
|---|---|---|---|---|
| 7,323,719 B2 * | 1/2008 | Kawaguchi | ..................... | 257/79 |
| 2002/0123157 A1* | 9/2002 | Lee | .................................. | 438/1 |

(Continued)

FOREIGN PATENT DOCUMENTS

| | | |
|---|---|---|
| JP | 2002-293699 A | 10/2002 |
| JP | 2003-048799 A | 2/2003 |

(Continued)

OTHER PUBLICATIONS

Derwent Translation of WO 2007/029655; 2007.*

(Continued)

*Primary Examiner* — Guinever Gregorio
(74) *Attorney, Agent, or Firm* — Ostrolenk Faber LLP

(57) ABSTRACT

Affords Group-III nitride single-crystal ingots and III-nitride single-crystal substrates manufactured utilizing the ingots, as well as methods of manufacturing III-nitride single-crystal ingots and methods of manufacturing III-nitride single-crystal substrates, wherein the incidence of cracking during length-extending growth is reduced. Characterized by including a step of etching the edge surface of a base substrate, and a step of epitaxially growing onto the base substrate hexagonal-system III-nitride monocrystal having crystallographic planes on its side surfaces. In order to reduce occurrences of cracking during length-extending growth of the ingot, depositing-out of polycrystal and out-of-plane oriented crystal onto the periphery of the monocrystal must be controlled. A layer of the base substrate edge surface, as just described, where it has been mechanically altered is removed beforehand by etching, whereby crystallographic planes form on the side surfaces of the III-nitride single-crystal ingot that is formed onto the base substrate, which therefore controls depositing-out of polycrystal and out-of-plane oriented crystal and reduces occurrences of cracking.

5 Claims, 4 Drawing Sheets

(56) References Cited

U.S. PATENT DOCUMENTS

| | | | |
|---|---|---|---|
| 2005/0098090 A1* | 5/2005 | Hirota et al. | 117/2 |
| 2006/0270200 A1* | 11/2006 | Shibata | 438/481 |
| 2010/0288191 A1* | 11/2010 | Takeyama | 117/95 |

FOREIGN PATENT DOCUMENTS

| | | |
|---|---|---|
| JP | 2005-112641 A | 4/2005 |
| JP | 2006-124224 A | 5/2006 |
| JP | 2006-290697 A | 10/2006 |
| JP | 2007-106636 A | 4/2007 |
| JP | 2007-519591 A | 7/2007 |
| JP | 2007-223878 A | 9/2007 |
| JP | 2007-314360 A | 12/2007 |
| WO | WO-99-23693 A1 | 5/1999 |
| WO | WO-2005-041283 A1 | 5/2005 |
| WO | WO-2005-121415 A1 | 12/2005 |
| WO | WO-2007-029655 A1 | 3/2007 |

OTHER PUBLICATIONS

Translation WO2007029655.*

* cited by examiner

III-NITRIDE SINGLE-CRYSTAL INGOT, III-NITRIDE SINGLE-CRYSTAL SUBSTRATE, METHOD OF MANUFACTURING III-NITRIDE SINGLE-CRYSTAL INGOT, AND METHOD OF MANUFACTURING III-NITRIDE SINGLE-CRYSTAL SUBSTRATE

TECHNICAL FIELD

The present invention relates to Group-III nitride single-crystal ingots, III-nitride single-crystal substrates, methods of manufacturing III-nitride single-crystal ingots, and methods of manufacturing III-nitride single-crystal substrates.

BACKGROUND ART

Substrates employed in semiconductor microelectronic and other devices are generally manufactured by a method in which a monocrystal is epitaxially grown onto a seed crystal to create an ingot, and then the ingot is sliced. Various studies have been done on ways to reduce the cost of manufacturing the substrates in situations where this manufacturing method is employed.

With the objective of reducing crystalline defects due to dislocations, Patent Document 1 discloses a method according to which a mask layer having window openings is formed onto a seed crystal (substrate), and a monocrystal is grown through the mask layer. Also given is a method of obtaining GaN single-crystal substrates by employing GaN crystal as a seed crystal, epitaxially growing a GaN monocrystal onto the GaN crystal to form an ingot, and then slicing the ingot into a plurality of wafers.

Patent Document 2, meanwhile, as a way to fabricate large-area substrates having uniformly low dislocation density, sets forth a method including a first stage of growing a Group III-V nitride material under pit-forming growth conditions, and a second stage of growing a III-V nitride material under pit-filling conditions.

Patent Document 1: Int'l. App. Pub. No. 1999/23693 (pamphlet)

Patent Document 2: Japanese Nat'l. Stage App. Pub. No. 2007-519591

SUMMARY OF INVENTION

Technical Problem

As one way to reduce the cost of manufacturing GaN and other III-nitride substrates, lengthening of the ingot has been proposed. A problem, however, has been that cracking that occurs during growth of the III-nitride monocrystal impedes length-extending growth.

In the process of growing III-nitride monocrystal, due to the effects of gas-flow variation during growth, and of crystal-quality loss along the margin and at the corners and edge surface of the base substrate, polycrystal and out-of-plane oriented crystal sometimes deposits out onto the periphery of the III-nitride crystal. A peculiarity of III-nitride crystals, meanwhile, is that they are anisotropic in terms of thermal expansion coefficient. In the case of GaN crystal, for example, the a-plane thermal expansion coefficient is $5.59 \times 10^{-6}/°C.$, whereas the c-plane thermal expansion coefficient is $3.17 \times 10^{-6}/°C.$ Consequently, during growth of III-nitride monocrystal, in cases where polycrystal and out-of-plane oriented crystal has deposited onto the periphery of the monocrystal, a thermal stress discrepancy, deriving from the difference in thermal expansion coefficient, develops between the monocrystal, and the polycrystal and out-of-plane orientated crystal deposited onto the periphery of the monocrystal. The problem has been that this discrepancy in thermal stress has been a root cause of cracks developing during crystal growth, which has stood in the way of growing ingots of extended length.

An object of the present invention, brought about taking the foregoing into consideration, is to make available Group-III nitride single-crystal ingots and III-nitride single-crystal substrates manufactured utilizing the ingots, as well as a method of manufacturing III-nitride single-crystal ingots and a method of manufacturing III-nitride single-crystal substrates, wherein the incidence of cracking during length-extending growth is reduced.

Solution to Problem

In order to accomplish the above-stated objective a method, involving the present invention, of manufacturing a III-nitride single-crystal ingot is characterized by including a step of etching the edge surface of a base substrate, and a step of epitaxially growing onto the base substrate hexagonal-system III-nitride monocrystal having crystallographic planes on its side surfaces.

Furthermore, a III-nitride single-crystal ingot involving the present invention is a III-nitride single-crystal ingot consisting of hexagonal-system III-nitride monocrystal, characterized in being hexagonal in cross section when sliced along a plane perpendicular to its thickness dimension, and in that its side surfaces are crystallographic planes.

In order to reduce occurrences of cracking during length-extending growth of the ingot, depositing-out of polycrystal and out-of-plane oriented crystal onto the periphery of the monocrystal must be controlled to a minimum. As given by the aforementioned method of manufacturing a III-nitride single-crystal ingot, a layer of the base substrate edge surface where it has been mechanically altered is removed beforehand by etching, whereby crystallographic planes form on the side surfaces of the III-nitride single-crystal ingot that is formed onto the base substrate, which therefore controls depositing-out of polycrystal and out-of-plane oriented crystal to a minimum and reduces occurrences of cracking. Likewise, by means of the aforementioned III-nitride single-crystal ingot, because depositing of polycrystal and out-of-plane oriented crystal out onto the side surface is controlled, cracking is minimized.

In the foregoing method of manufacturing a III-nitride single-crystal ingot, the crystallographic planes preferably are at least one from among $\{10\bar{1}0\}$ planes, $\{10\bar{1}1\}$ planes, $\{10\bar{1}2\}$ planes, $\{10\bar{1}\bar{1}\}$ planes, and $\{10\bar{1}\bar{2}\}$ planes.

Likewise, the crystallographic planes of the foregoing III-nitride single-crystal ingot preferably are at least one among $\{10\bar{1}0\}$ planes, $\{10\bar{1}1\}$ planes, $\{10\bar{1}2\}$ planes, $\{10\bar{1}\bar{1}\}$ planes, and $\{10\bar{1}\bar{2}\}$ planes.

By the side-surface crystallographic planes of the III-nitride single-crystal ingot being the aforementioned planes, the depositing-out of polycrystal and out-of-plane oriented crystal is controlled to a minimum, which also reduces cracking.

With the foregoing method of manufacturing a III-nitride single-crystal ingot it is also preferable that in the step of epitaxially growing III-nitride monocrystal, a first region, containing the center of the III-nitride single-crystal ingot in a cross section perpendicular to its thickness dimension and extending along the thickness dimension of the III-nitride single-crystal ingot, and a second region, containing the side surfaces of the III-nitride single-crystal ingot and located on the perimeter of the first region and having an oxygen-impurity concentration that differs from that of the first region, be formed, with the oxygen-impurity concentration of the first region being $1\times10^{16}$ to $1\times10^{18}$ cm$^{-3}$ and the oxygen-impurity concentration of the second region being $1\times10^{17}$ to $1\times10^{19}$ cm$^{-3}$, and with the oxygen-impurity concentration of the second region being greater than the oxygen-impurity concentration of the first region. Now it should be understood that $1\times10^{16}$ cm$^{-3}$ herein is the limit on oxygen-impurity concentration measurement by secondary ion mass spectrometry (SIMS), and in practice includes concentrations below $1\times10^{16}$ cm$^{-3}$.

Likewise, the foregoing III-nitride single-crystal ingot preferably has a first region, containing the center of the III-nitride single-crystal ingot in a cross section perpendicular to its thickness dimension and extending along the thickness dimension of the III-nitride single-crystal ingot, and a second region, containing the side surfaces and disposed on the perimeter of the first region and having an oxygen-impurity concentration that differs from that of the first region, with the oxygen-impurity concentration of the first region being $1\times10^{16}$ to $1\times10^{18}$ cm$^{-3}$ and the oxygen-impurity concentration of the second region being $1\times10^{17}$ to $1\times10^{19}$ cm$^{-3}$, and with the oxygen-impurity concentration of the second region being greater than the oxygen-impurity concentration of the first region.

Studies by the inventors led to the realization that in a III-nitride single-crystal ingot having crystallographic planes on its side surfaces, having the oxygen-impurity concentration be the given range makes it possible to reduce the incidence of cracking further. Accordingly, having the ingot be in the foregoing mode enables effectively controlling cracking occurrence to a minimum.

The foregoing method of manufacturing a III-nitride single-crystal ingot may assume a mode in which the base substrate contains at least one among silicon, sapphire, silicon carbide, spinel crystal, gallium nitride, and aluminum nitride.

The foregoing method of manufacturing a III-nitride single-crystal ingot may also adopt a mode in which the angle that the major surface of the base substrate forms with any one plane among the {0001} planes, the {10$\bar{1}$0} planes, the {10$\bar{1}$1} planes, the {10$\bar{1}$2} planes, the {11$\bar{2}$0} planes, the {11$\bar{2}$1} planes and the {11$\bar{2}$2} planes of the base substrate is between 0° and 5°, inclusive. In addition, the base substrate may assume a mode in which its cross section perpendicular to its thickness dimension is round, or in which its side surfaces consist of {10$\bar{1}$0} planes and its cross section perpendicular to the thickness dimension is hexagonal.

By having the base substrate utilized in order to manufacture a III-nitride single-crystal ingot assume the just-described mode, depositing-out of polycrystal and out-of-plane oriented crystal can be more effectively restrained, therefore efficaciously controlling cracking occurrences to a minimum.

A III-nitride single-crystal substrate manufacturing method involving the present invention is characterized in that a III-nitride single-crystal ingot obtained by an above-described III-nitride single-crystal ingot manufacturing method is sliced to form III-nitride single-crystal substrates.

Further, a III-nitride single-crystal substrate involving the present invention is characterized in being obtained by slicing an above-described III-nitride single-crystal ingot into plate form.

In this way, utilizing to manufacture III-nitride single-crystal substrates a III-nitride single-crystal ingot in which the incidence of cracking during length-extending growth is reduced enables the highly efficient manufacture of III-nitride single-crystal substrates.

Advantageous Effects of Invention

The present invention affords III-nitride single-crystal ingots in which the incidence of cracking during length-extending growth is reduced, III-nitride single-crystal substrates manufactured utilizing the ingots, methods of manufacturing the III-nitride single-crystal ingots, and methods of manufacturing the III-nitride single-crystal substrates.

REFERENCE SIGNS LIST 1, 2, 3: III-nitride single-crystal ingot; 10: base substrate; 11: GaN monocrystal; 30: vapor-phase deposition apparatus.

DESCRIPTION OF EMBODIMENTS

Hereinafter, referring to the accompanying drawings, an explanation of modes of embodying the present invention will be made in detail. It should be understood that in describing the drawings, with the same reference marks being used for identical or equivalent features, reduplicating description will be omitted.

Figure 1A:
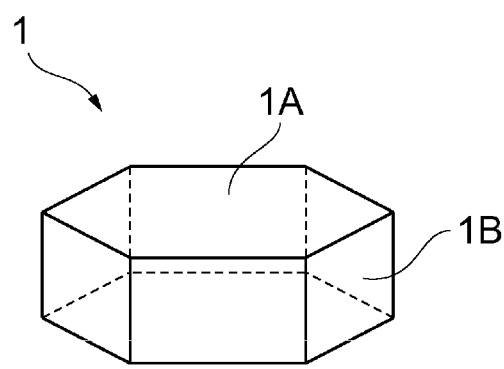
FIG. 1A is perspective view representing a III-nitride single-crystal ingot 1 involving an advantageous mode of embodying the present invention.
Figure 1B:
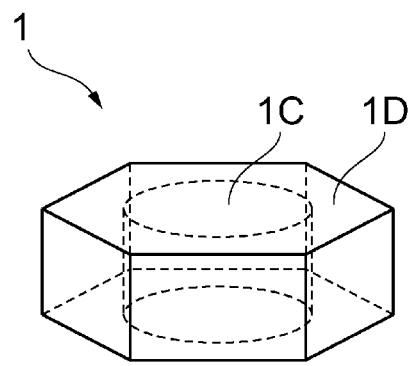
FIG. 1B similarly is a perspective view representing a III-nitride single-crystal ingot 1 involving an advantageous mode of embodying the present invention.

FIG. 1A and FIG. 1B are perspective views representing a III-nitride single-crystal ingot 1 involving an advantageous mode of embodying the present invention. The III-nitride single-crystal ingot 1 consists of hexagonal-system III-nitride monocrystal. While it is preferable for the III-nitride to consist of GaN, other Group-III atoms may be included instead of Ga. In that case, In, Al, etc. may for example be used.

As illustrated in FIG. 1A, the III-nitride single-crystal ingot 1 is in the form of a hexagonal column, and a transecting plane through a cross section perpendicular to the ingot's thickness dimension has a hexagonal geometry. Further, the crystallographic plane being the major surface 1A is a {0001} plane, while the crystallographic planes being the side surfaces 1B are {10$\bar{1}$0} planes.

And as illustrated in FIG. 1B, the III-nitride single-crystal ingot 1 is provided with respective divisions within the ingot, having two different classes of oxygen impurity concentration. A center portion (first region) 1C is a division that is located in the center portion in a cross section perpendicularly transecting the thickness dimension, and that extends along the thickness dimension, while a lateral portion (second region) 1D is located surrounding the center portion 1C, and includes the side surfaces 1B. It is preferable that the oxygen-impurity concentration of the center portion 1C be $1 \times 10^{16}$ to $1 \times 10^{18}$ cm$^{-3}$ and that the oxygen-impurity concentration of the lateral portion 1D be $1 \times 10^{17}$ to $1 \times 10^{19}$ cm$^{-3}$, with the oxygen-impurity concentration of the lateral portion 1D preferably being higher than the oxygen-impurity concentration of the center portion 1C.

Figure 2:
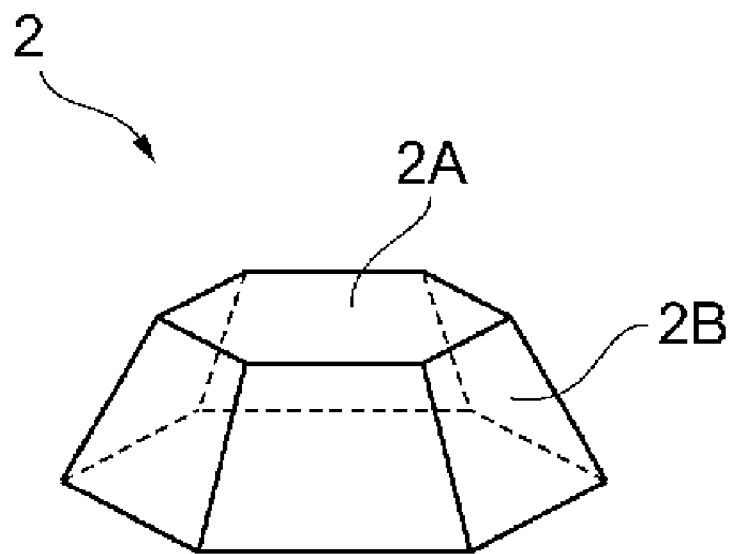
FIG. 2 is a perspective view representing a III-nitride single-crystal ingot 2 involving an advantageous mode of embodying the present invention.

FIG. 2 is a diagram illustrating the structure of a III-nitride single-crystal ingot 2. The III-nitride single-crystal ingot 2 is in a separate form of III-nitride single-crystal ingots involving the present embodying mode, and like the III-nitride single-crystal ingot 1, its transecting plane through a cross section perpendicular to the thickness dimension is hexagonal. The size of the transecting plane, however, is largest at the undersurface and grows smaller and smaller heading toward the top surface.

Also, the crystallographic plane being the major surface 2A is a {0001} plane, while the crystallographic planes being the side surfaces 2B are {$10\bar{1}1$} planes or {$10\bar{1}2$} planes.

Figure 3:
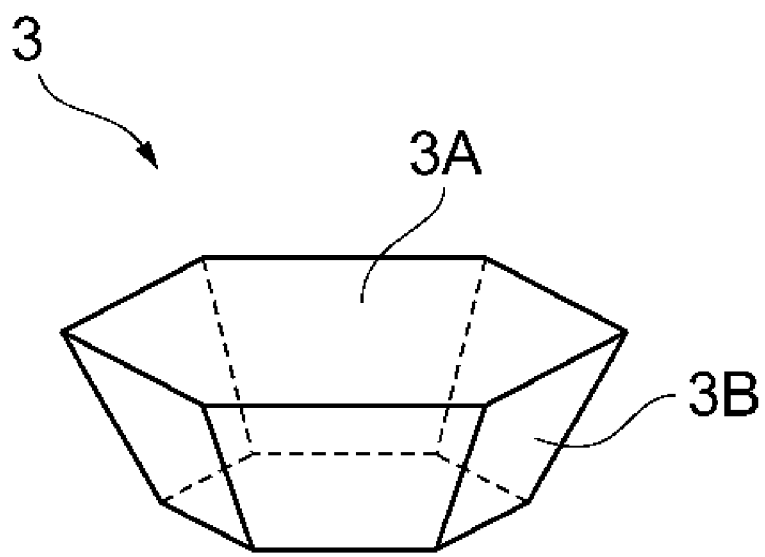
FIG. 3 is a perspective view representing a III-nitride single-crystal ingot 3 involving an advantageous mode of embodying the present invention.

FIG. 3 is a diagram illustrating the structure of a III-nitride single-crystal ingot 3. The III-nitride single-crystal ingot 3 is in a separate form of III-nitride single-crystal ingots involving the present embodying mode, and like the III-nitride single-crystal ingots 1 and 2, its transecting plane through a cross section perpendicular to the thickness dimension is hexagonal. The size of the transecting plane, however, is smallest at the undersurface and grows larger and larger heading toward the top surface. Also, the crystallographic plane being the major surface 3A is a {0001} plane, while the crystallographic planes being the side surfaces 3B are {$10\bar{1}1$} planes or {$10\bar{1}2$} planes.

The differences in the structure of the III-nitride single-crystal ingots 1 through 3 illustrated in FIG. 1A through FIG. 3 are brought about by means of the deposition parameters during the epitaxial growth of the III-nitride monocrystal.

It should be noted that in the foregoing III-nitride single-crystal ingots 1 through 3 illustrated in FIG. 1A through FIG. 3, although the plane orientation of the major surface was a {0001} plane, it may be other crystallographic planes. Examples that may be given of advantageous crystallographic planes as the major surface are: the {$10\bar{1}0$} planes, the {$10\bar{1}1$} planes, the {$10\bar{1}2$} planes, the {$11\bar{2}0$} planes, the {$11\bar{2}1$} planes and the {$11\bar{2}2$} planes. In instances where these planes are the major-surface crystallographic planes, the side surfaces will be constituted along crystallographic planes that differ from the foregoing crystallographic planes indicated in FIGS. 1A through 3.

Next, methods, involving the present embodying mode, of manufacturing a III-nitride single-crystal ingot and of manufacturing III-nitride single-crystal substrates obtained by slicing the III-nitride single-crystal ingot will be explained. Here, with the following III-nitride single-crystal ingot manufacturing method, the explanation will be made taking as examples a GaN single-crystal ingot obtained by utilizing a GaN crystal as the base substrate, epitaxially growing GaN monocrystal onto the base substrate, and removing the base substrate, and GaN single-crystal substrates obtained by slicing the GaN single-crystal ingot.

A GaN single-crystal ingot involving the present embodying mode is produced by putting the base substrate through an etching process, then epitaxially growing GaN monocrystal onto the base substrate by a hydride vapor-phase epitaxy (HVPE) technique and afterwards removing the base substrate. The epitaxy method is not thus limited, however; a technique such as metal-organic chemical vapor deposition (MOCVD) may also be employed.

Figure 4A:
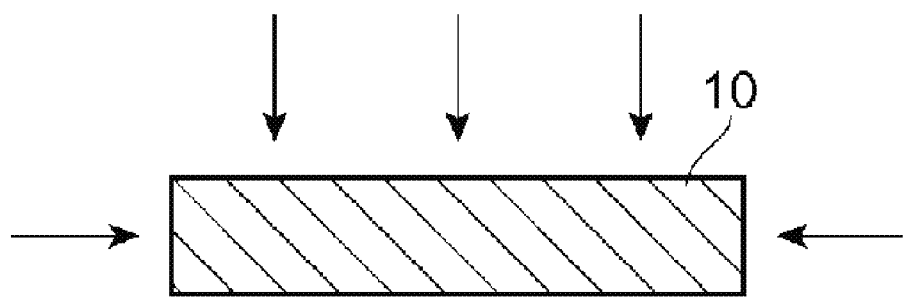
FIG. 4A is a diagram to illustrate a method of manufacturing an ingot consisting of GaN monocrystal.
Figure 4B:
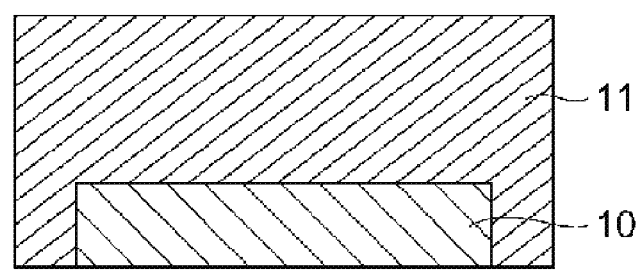
FIG. 4B similarly is a diagram to illustrate a method of manufacturing an ingot consisting of GaN monocrystal.

FIG. 4A and FIG. 4B are diagrams for setting forth a method of manufacturing ingots consisting of GaN monocrystal. The major surface of the GaN crystal utilized as the base substrate 10 consists of the (0001) plane. To begin with, as indicated in FIG. 4A, etching is carried out on the major surface and the edge surface of the base substrate 10. The etching is performed for example by executing a 1-hour vapor-phase etch under a 0.2 atm HCl partial-pressure, 0.8 atm N$_2$ partial-pressure atmosphere, in a state in which a 1050° C. temperature is maintained. The etching removes a portion of at least 1 μm thickness or more from the edge surface. Carrying out etching under the aforesaid conditions implements the etch not only on the base substrate major surface, but on its edge surface as well. The etching process removes a layer of the base substrate corners and edge surface where it has been mechanically altered. Depositing-out of polycrystal and out-of-plane oriented crystal along the periphery of the later-described GaN single-crystal ingot is thereby restrained. Here, the etching process may be carried out employing the vapor-phase deposition apparatus depicted in FIG. 5.

Next, as indicated in FIG. 4B, GaN monocrystal 11 is grown onto the base substrate 10 having been etched.

Figure 5:
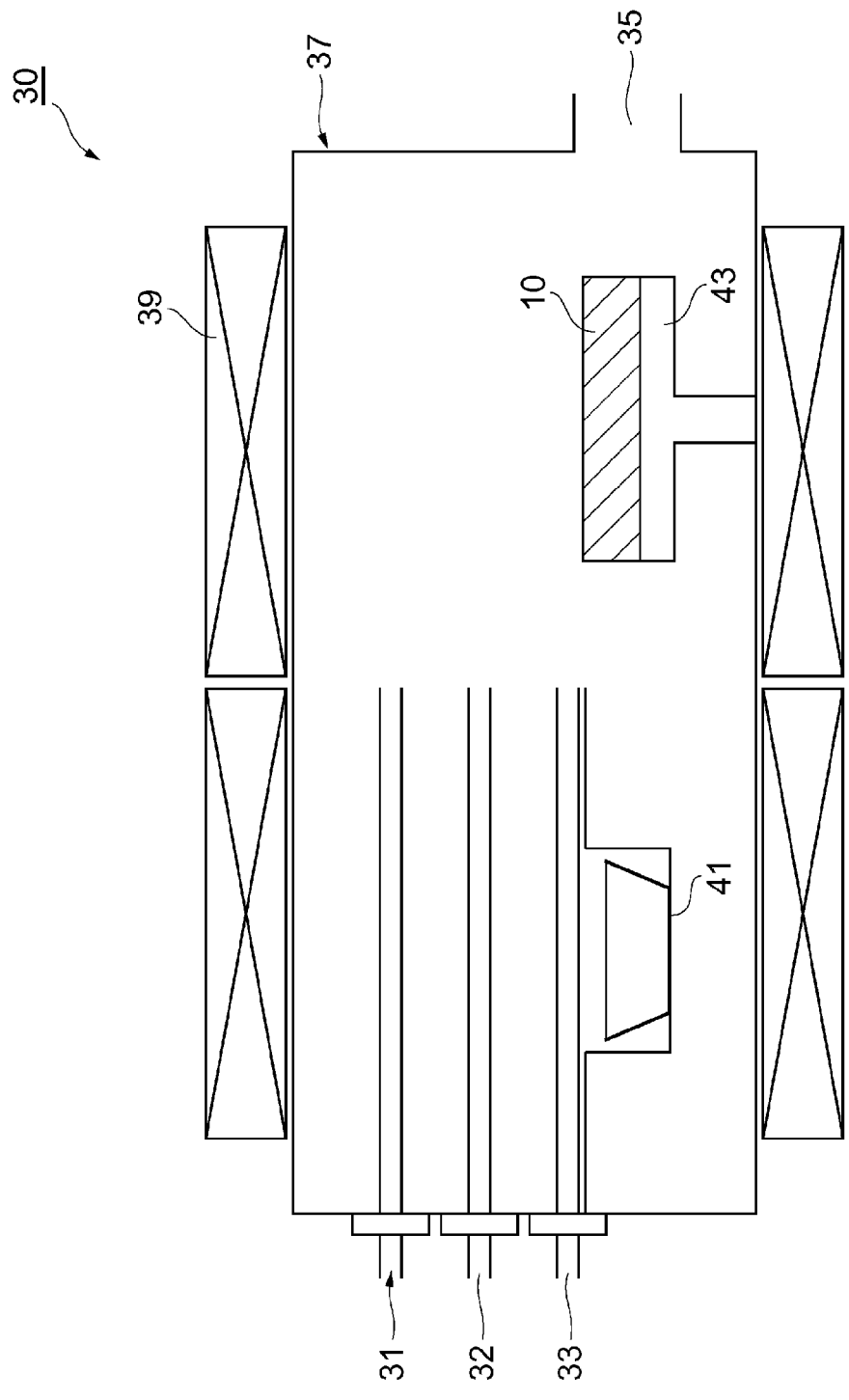
FIG. 5 is a diagram representing an ordinary-pressure vapor-phase deposition apparatus 30 employed in HVPE deposition.

FIG. 5 is a diagram representing an ordinary-pressure vapor-phase deposition apparatus 30, employed in HVPE deposition. The vapor-phase deposition apparatus 30 is composed of a first gas-introduction port 31, a second gas-introduction port 32, a third gas-introduction port 33, a reaction chamber 37 having an exhaust port 35, and a resistive heater 39 for heating the reaction chamber 37. Further, a source boat 41 into which metallic Ga is put, and a rotary support member 43 for supporting the base substrate 10 are provided inside the reaction chamber 37.

Utilizing the above-described vapor-phase deposition apparatus 30, initially the base substrate 10 is placed on the rotary support member 43 in the vapor-phase deposition apparatus 30. Gaseous ammonia (NH$_3$) as a precursor gas is flowed through the first gas-introduction port 31. And similarly, gaseous hydrogen chloride (HCl) as a precursor gas is flowed through the third gas-introduction port 33. The carrier gas for either of these precursor gases is gaseous hydrogen. In addition, as dopant gases, gaseous SiF$_4$ and gaseous O$_2$ are flowed through the second gas-introduction port. The carrier gas for the dopant gases is also gaseous hydrogen.

The gaseous hydrogen chloride introduced through the third gas-introduction port 33 reacts with the metallic Ga within the source boat 41 according to the following formula.

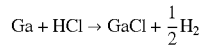

Chem. 1

Gaseous GaCl (gallium chloride) is thereby generated, and together with the gaseous hydrogen that is the carrier gas is supplied to the base substrate 10. Meanwhile, the base substrate 10 is ramped up to 1100° C., whereat a reaction having the following formula takes place along the base substrate 10.

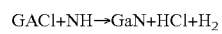

Chem. 2

GaN monocrystal 11, as represented in FIG. 4B, is thereby epitaxially grown onto the base substrate 10 major surface and along its edge surface. By optimizing flow control of the aforementioned gases and optimizing the growth temperature and growth rate, the side surfaces of the GaN monocrystal 11 may be made to have a structure composed of crystallographic planes.

Thereafter the GaN monocrystal 11 is peripherally machined, the base substrate is removed, and by executing processing steps including grinding, polishing, and dry-etching, a GaN single-crystal ingot is obtained. It is preferable that the diameter of the GaN single-crystal ingot be 25 to 160 mm and that its thickness be 2 to 160 mm.

The manufacturing method described above yields a GaN single-crystal ingot whose side surfaces consist of crystallographic planes, and in which polycrystal and out-of-plane oriented crystal do not deposit out onto the side surfaces. Consequently controlling damage from cracks, etc. during manufacture realizes length-extending growth, therefore enabling the highly efficient manufacture of GaN single-crystal ingots. In turn, utilizing the ingots to manufacture GaN single-crystal substrates enables GaN single-crystal substrates in which damage from cracking is minimized to be made available with a high level of efficiency.

Building semiconductor layers and metallization layers onto the major surface of the GaN single-crystal substrates makes the fabrication of a variety of microelectronic devices possible.

For example, the above-described GaN single-crystal substrates can be utilized as the substrates for optoelectronic devices such as light-emitting diodes and laser diodes, and for microelectronic devices such as rectifiers, field-effect transistors, and high electron mobility transistors (HEMTs). Furthermore, III-nitride single-crystal substrates involving the present embodying mode can be utilized as the substrates for semiconductor device such as temperature sensors, pressure sensors, radiation sensors, and visible-blind ultraviolet detectors, and in other applications, for SAW devices, vibrators, resonators, oscillators, microelectromechanical system (MEMS) parts, and piezoelectric actuators.

While in the foregoing, advantageous modes of embodying the present invention have been specifically illustrated, the present invention is not limited to them; various modifications are possible. For example, the vapor-phase deposition apparatus 30 represented in FIG. 5 has a sideways structure, but a vapor-phase deposition apparatus possessing a vertically extending structure may be utilized. The manufacturing procedure may also be carried out loading a plurality of base substrates into the vapor-phase deposition apparatus at the same time. In addition, while gaseous hydrogen is employed as carrier gas in the present embodying modes, other carrier gases may be employed as well.

EXAMPLE

Below, a description of the present invention will be made further detail, taking III-nitride single-crystal ingots produced based upon the above-described manufacturing methods as embodiment examples, and taking III-nitride single-crystal ingots produced based upon conventional manufacturing methods as comparative examples, but the present invention is not limited to the following embodiment examples.

Example 1

A base substrate consisting of gallium nitride (GaN), having a circular form of 105 mm diameter and being 400 µm in thickness, with its major surface being the (0001) plane, was prepared. The base substrate was placed onto the rotary support member 43 in the vapor-phase deposition apparatus 30 depicted in FIG. 5. As a preprocess to begin with, the substrate temperature was raised to 800° C., and under a 0.2 atm HCl partial-pressure, 0.8 atm $N_2$ partial-pressure atmosphere, the major surface and the edge surface of the base substrate were put through a vapor-phase etching process. This resulted in the etching off of a region of at least not less than 1 µm thickness from the major surface and the edge surface of the base substrate. After that, gaseous ammonia ($NH_3$) as a precursor gas was flowed through the first gas-introduction port 31. And similarly, gaseous hydrogen chloride (HCl) as a precursor gas was flowed through the third gas-introduction port 33. The carrier gas for either of these precursor gases was gaseous hydrogen. In addition, as dopant gases, gaseous $SiF_4$ and gaseous $O_2$ were flowed through the second gas-introduction port 32 with gaseous hydrogen as the carrier gas. Together with the substrate the temperature thereof was ramped up to 1100° C. to react the precursor gases.

GaN monocrystal was epitaxially grown onto the base substrate on the rotary support member 43 by the just-described method, at a growth rate of 100 µm/hour and until reaching a thickness of about 20 mm, yielding a GaN single-crystal ingot involving Example 1. The cross section of the grown GaN single-crystal ingot along a direction perpendicular to its thickness dimension had a hexagonal geometry, and on the side surfaces, crystallographic planes consisting of {10$\bar{1}$0} planes were formed. What is more, no polycrystal had deposited out onto the side surfaces of the GaN single-crystal ingot, nor were there any occurrences of cracks.

The oxygen-impurity concentration of the thus-obtained GaN single-crystal ingot was characterized by secondary ion mass spectrometry (SIMS), whereupon in the ingot central portion the concentration was not greater than $1 \times 10^{16}$ cm$^{-3}$, and in the lateral portion it was $1 \times 10^{18}$ cm$^{-3}$. Here, on account of $1 \times 10^{16}$ cm$^{-3}$ being the limit on oxygen-impurity concentration measurement by SIMS, concentration below $1 \times 10^{16}$ cm$^{-3}$ could not be determined.

Example 2

The GaN single-crystal ingot of Example 2, excepting the geometry of the base substrate, is the same as the GaN single-crystal ingot of Example 1. In particular, a base substrate consisting of gallium nitride, having a major surface in the form of a hexagon 62 mm to a side and being 400 µm in thickness, with its major surface being the (0001) plane and with the crystallographic planes of its edge surface being {10$\bar{1}$0} planes, was prepared as the base substrate. In the same way as with Example 1, the base substrate was placed onto the rotary support member 43 within the vapor-phase deposition apparatus 30, following which, as a preprocess, a thickness of not less than 1 µm was vapor-phase etched from the major surface and the edge surface of the base substrate. Following the preprocess, GaN monocrystal was epitaxially grown onto the major surface of the base substrate, yielding a GaN single-crystal ingot involving Example 2.

The cross section of the Example-2 GaN single-crystal ingot along a direction perpendicular to its thickness dimension had a hexagonal geometry, and on the side surfaces crystallographic planes were formed. Formation of the side-surface crystallographic planes took place more smoothly than in Example 1. What is more, no polycrystal had deposited out onto the side surfaces of the GaN single-crystal ingot, nor were there any occurrences of cracks. The oxygen-impurity concentration in the ingot central portion was not greater than $1 \times 10^{16}$ cm$^{-3}$, and in the lateral portion it was $1 \times 10^{18}$ cm$^{-3}$.

Example 3

The GaN single-crystal ingot of Example 3, excepting the method whereby it is preprocessed, is the same as the GaN single-crystal ingot of Example 1. In particular, a base substrate consisting of gallium nitride was prepared. The reverse side of the base substrate was coated, and was subjected to liquid-phase etching within a KOH-melt solution that had been heated to 320° C. As a result, a thickness of not less than 1 μm was etched from the major surface and the edge surface of the base substrate. The base substrate on which the preprocess had thus been implemented was placed onto the rotary support member 43 within the vapor-phase deposition apparatus 30, and GaN monocrystal was epitaxially grown onto the major surface of the base substrate, yielding a GaN single-crystal ingot involving Example 3.

The cross section of the Example-3 GaN single-crystal ingot along a direction perpendicular to its thickness dimension had a hexagonal geometry, and on the side surfaces crystallographic planes were formed. Further, while an extremely slight depositing-out of polycrystal onto the side surfaces of the GaN single-crystal ingot could be confirmed, there were no occurrences of cracks. The oxygen-impurity concentration in the ingot central portion was not greater than $1 \times 10^{16}$ cm$^{-3}$, and in the lateral portion it was $1 \times 10^{18}$ cm$^{-3}$.

Examples 4 and 5

The GaN single-crystal ingots of Examples 4 and 5, with the exception of the GaN single-crystal ingots' oxygen-impurity concentrations, are the same as the GaN single-crystal ingot of Example 1. In epitaxially growing GaN monocrystal onto the major surface of the base substrate having been placed onto the rotary support member 43 in the vapor-phase deposition apparatus 30 depicted in FIG. 5 and subjected to the preprocess, the ratios of the gaseous SiF$_4$ and gaseous O$_2$ contained in the dopant gases flowed through the second gas-introduction port 32 were adjusted. In this manner varying the quantity of oxygen doping the GaN single-crystal ingots, the GaN monocrystal was epitaxially grown, yielding the GaN single-crystal ingots of Example 4 and Example 5.

The cross section of the Example-4 GaN single-crystal ingot along a direction perpendicular to its thickness dimension had a hexagonal geometry, and on the side surfaces crystallographic planes were formed. Further, while an extremely slight depositing-out of polycrystal onto the side surfaces of the GaN single-crystal ingot could be confirmed, there were no occurrences of cracks. The oxygen-impurity concentration in the ingot central portion was $5 \times 10^{17}$ cm$^{-3}$, and in the lateral portion it was $5 \times 10^{19}$ cm$^{-3}$.

Likewise, the cross section of the Example-5 GaN single-crystal ingot along a direction perpendicular to its thickness dimension had a hexagonal geometry, and on the side surfaces crystallographic planes were formed. What is more, no polycrystal had deposited out onto the side surfaces of the GaN single-crystal ingot, nor were there any occurrences of cracks. The oxygen-impurity concentration in the ingot central portion was not greater than $1 \times 10^{16}$ cm$^{-3}$, and in the lateral portion it was $3 \times 10^{17}$ cm$^{-3}$.

Examples 6 and 7

The GaN single-crystal ingots of Examples 6 and 7, with the exception of the GaN single-crystal ingots' oxygen-impurity concentrations, are the same as the GaN single-crystal ingot of Example 2. In epitaxially growing GaN monocrystal onto the major surface of the base substrate having been placed onto the rotary support member 43 in the vapor-phase deposition apparatus 30 depicted in FIG. 5 and subjected to the preprocess, the ratios of the gaseous SiF$_4$ and gaseous O$_2$ contained in the dopant gases flowed through the second gas-introduction port 32 were adjusted. In this manner varying the quantity of oxygen doping the GaN single-crystal ingots, the GaN monocrystal was epitaxially grown, yielding the GaN single-crystal ingots of Example 6 and Example 7.

The cross section of the Example-6 GaN single-crystal ingot along a direction perpendicular to its thickness dimension had a hexagonal geometry, and on the side surfaces crystallographic planes were formed. Further, polycrystal had deposited out extremely slightly onto the side surfaces of the GaN single-crystal ingot, and also a few cracks having occurred could be confirmed. The oxygen-impurity concentration in the ingot central portion was $8 \times 10^{17}$ cm$^{-3}$, and in the lateral portion it was $8 \times 10^{19}$ cm$^{-3}$.

Likewise, the cross section of the Example-7 GaN single-crystal ingot along a direction perpendicular to its thickness dimension had a hexagonal geometry, and on the side surfaces crystallographic planes were formed. Further, no polycrystal had deposited out onto the side surfaces of the GaN single-crystal ingot, although a few cracks having occurred could be confirmed. The oxygen-impurity concentration in the ingot central portion was not greater than $1 \times 10^{16}$ cm$^{-3}$, and in the lateral portion it was $1 \times 10^{17}$ cm$^{-3}$.

Comparative Example 1

The GaN single-crystal ingot of Comparative Example 1, except for not being put through the preprocess, is the same as the GaN single-crystal ingot of Example 2. A base substrate consisting of gallium nitride, having a major surface in the form of a hexagon 62 mm to a side and being 400 μm in thickness, with its major surface being the (0001) plane and with the crystallographic planes of its edge surface being {10$\overline{1}$0} planes, was prepared. The base substrate was placed onto the rotary support member 43 in the vapor-phase deposition apparatus 30 represented in FIG. 5. GaN monocrystal was epitaxially grown onto the major surface of the base substrate, yielding a GaN single-crystal ingot involving Comparative Example 1.

On the side surfaces of the GaN single-crystal ingot of Comparative Example 1, crystallographic planes did not form. Further, a large amount of polycrystal deposited out onto the side surfaces of the GaN single-crystal ingot, wherein numerous cracks occurred. The oxygen-impurity concentration in the ingot central portion was not greater than $1 \times 10^{16}$ cm$^{-3}$, and in the lateral portion it was $1 \times 10^{18}$ cm$^{-3}$.

With regard to the above-described Examples 1 through 7 and Comparative Example 1, the geometry of the base substrate, the presence/absence of, as well as the method of, the growth preprocess, the oxygen-impurity concentration, the crystallographic planes on the side surfaces, the depositing out of polycrystal on the side surfaces, and the presence/absence of cracks are tabulated in Table I. The results, as indicated in Table I, are that carrying out a preprocess on the base substrates prior to epitaxially growing GaN monocrystal onto the base substrates makes it possible to form onto the base substrates GaN single-crystal ingots possessing crystallographic planes on their side surfaces, and having a hexagonal cross section. What is more, depositing-out of polycrystal and out-of-plane oriented crystal along the side surfaces is controlled to a minimum. And by adjusting the oxygen-impurity concentration in the central portion and lateral portion of the GaN single-crystal ingots by means of the dopant gas, depositing-out of polycrystal on the side surfaces and occurrence of cracks could be further controlled, which enabled length-extended GaN single-crystal ingots to be manufactured highly efficiently.

TABLE I

| | Undersubstrate | Growth preprocess | Oxygen-impurity concentration (cm$^{-3}$) Central portion | Lateral portion | Side-surface crystallographic faces | Side-surface polycrystal deposition | Cracks |
|---|---|---|---|---|---|---|---|
| Emb. 1 | Round | Vapor-phase etch | $<1 \times 10^{16}$ | $1 \times 10^{18}$ | Present | None | None |
| 2 | Hexagonal | Vapor-phase etch | $<1 \times 10^{16}$ | $1 \times 10^{18}$ | Present | None | None |
| 3 | Round | Liquid-phase etch | $<1 \times 10^{16}$ | $1 \times 10^{18}$ | Present | Extremely slight | None |
| 4 | Round | Vapor-phase etch | $5 \times 10^{17}$ | $5 \times 10^{19}$ | Present | Extremely slight | None |
| 5 | Round | Vapor-phase etch | $<1 \times 10^{16}$ | $3 \times 10^{17}$ | Present | None | None |
| 6 | Hexagonal | Vapor-phase etch | $8 \times 10^{17}$ | $8 \times 10^{19}$ | Present | Extremely slight | Few |
| 7 | Hexagonal | Vapor-phase etch | $<1 \times 10^{16}$ | $1 \times 10^{17}$ | Present | None | Few |
| Comp. Ex. 1 | Hexagonal | None | $<1 \times 10^{16}$ | $1 \times 10^{18}$ | Absent | Large amount | Numerous |

The invention claimed is:

1. A method of manufacturing a III-nitride single-crystal ingot, characterized by including:
   a base-substrate preparation step of machining a III-nitride base substrate into one of either a round form or a hexagonal form in which the base substrate has planar major surfaces and is either round or hexagonal in cross-section of the base substrate perpendicular to its thickness dimension;
   a preprocess step of either vapor- or liquid-phase etching the edge surface of the III-nitride base substrate prepared in said base-substrate preparation step, so as to remove at least 1 μm of the base-substrate edge surface; and
   a step of growing, by vapor-phase epitaxy, directly onto one of the major surfaces and the edge surface of the preprocessed base substrate, hexagonal-system III-nitride monocrystal by means of precursor gases and oxygen-containing dopant gas under growth conditions predetermined such that the side surfaces of the epitaxially grown monocrystal are crystallographic planes, to form the monocrystal as a first region, containing the center of the monocrystal in a cross section perpendicular to its thickness dimension and extending along the thickness dimension, and a second region, containing the side surfaces of the monocrystal and located on the perimeter of the first region, and such that the first region has an oxygen-impurity concentration that is at least an order of magnitude lesser than that of the second region, whereby the monocrystal is essentially crack-free.

2. A III-nitride single-crystal ingot manufacturing method as set forth in claim 1, characterized in that the crystallographic planes are at least one from among $\{10\bar{1}0\}$ planes, $\{10\bar{1}1\}$ planes, $\{10\bar{1}2\}$ planes, $\{10\bar{1}\bar{1}\}$ planes, and $\{10\bar{1}\bar{2}\}$ planes.

3. A III-nitride single-crystal ingot manufacturing method as set forth in claim 1,
   wherein in said epitaxial growth step, the amount of oxygen contained in the dopant gas is adjusted such that the oxygen-impurity concentration of the first region is $1 \times 10^{16}$ to $1 \times 10^{18}$ cm$^{-3}$ and the oxygen-impurity concentration of the second region is $1 \times 10^{17}$ to $1 \times 10^{19}$ cm$^{-3}$.

4. A III-nitride single-crystal ingot manufacturing method as set forth in claim 1, characterized in that the angle that a major surface of the base substrate forms with any one plane among the $\{0001\}$ planes, the $\{10\bar{1}0\}$ planes, the $\{10\bar{1}1\}$ planes, the $\{10\bar{1}2\}$ planes, the $\{11\bar{2}0\}$ planes, the $\{11\bar{2}1\}$ planes and the $\{11\bar{2}2\}$ planes of the base substrate is between 0° and 5°, inclusive.

5. A III-nitride single-crystal ingot manufacturing method as set forth in claim 1, characterized in that the cross section of the base substrate perpendicular to its thickness dimension is hexagonal and the side surfaces of the base substrate consist of $\{10\bar{1}0\}$ planes.

* * * * *